(12) United States Patent
Lim et al.

(10) Patent No.: US 9,209,414 B2
(45) Date of Patent: Dec. 8, 2015

(54) DISPLAY DEVICE

(71) Applicant: LG DISPLAY CO., LTD., Seoul (KR)

(72) Inventors: Yu Sok Lim, Seoul (KR); Byung Chul Ahn, Seoul (KR); Chang Dong Kim, Seoul (KR); Tae Joon Ahn, Paju-si (KR); Sang Moo Song, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/552,147

(22) Filed: Nov. 24, 2014

(65) Prior Publication Data
US 2015/0144921 A1  May 28, 2015

(30) Foreign Application Priority Data
Nov. 25, 2013  (KR) .................. 10-2013-0143533

(51) Int. Cl.
*H01L 51/00*  (2006.01)
*H01L 27/32*  (2006.01)
*H01L 51/52*  (2006.01)

(52) U.S. Cl.
CPC ........ *H01L 51/0097* (2013.01); *H01L 27/3244* (2013.01); *H01L 51/5281* (2013.01)

(58) Field of Classification Search
None
See application file for complete search history.

(56) References Cited

U.S. PATENT DOCUMENTS

2010/0308335 A1* 12/2010 Kim et al. .................. 257/59
2013/0076649 A1* 3/2013 Myers et al. ................ 345/173

* cited by examiner

*Primary Examiner* — Charles Garber
*Assistant Examiner* — Alia Sabur
(74) *Attorney, Agent, or Firm* — Birch, Stewart, Kolasch & Birch, LLP

(57) ABSTRACT

A display device is discussed which can include: a flexible substrate defined into a first area, a second area bent from an edge of the first area, and a third area outwardly expanded from the second area; a thin film transistor layer disposed on the substrate; an organic emission layer disposed on the thin film transistor layer; an encapsulation layer disposed on the organic emission layer; a polarization layer disposed on the encapsulation layer; and a cover window disposed on the polarization layer. The polarization layer is formed on the encapsulation layer opposite to the first and third areas of the substrate.

14 Claims, 4 Drawing Sheets

DISPLAY DEVICE

The present application claims priority under 35 U.S.C. §119(a) of Korean Patent Application No. 10-2013-0143533 filed on Nov. 25, 2013, which is hereby incorporated by reference in its entirety.

BACKGROUND OF THE INVENTION

1. Field of the Disclosure

The present application relates to a display device. More particularly, the present application relates to an organic light emitting diode (OLED) display device capable of being bent in a curvature radius below 5 mmR.

2. Description of the Related Art

In general, liquid crystal display (LCD) devices, plasma display panels (PDPs) and organic light emitting diode (OLED) display devices have features of thinner, lighter weight, lower power consumption and lower driving voltage compared to cathode ray tubes (CRTs). As such, the LCD devices, the PDPs and the OLED display devices are being widely applied to a variety of appliances. Particularly, the OLED display devices have features such as high response time, high light emission efficiency, high brightness and wide viewing angle because of using self-illuminating elements.

The recent technical development allows flexible display devices to come into the spotlight as a new technology of a display field, instead of the rigid display devices employing glass substrates. The flexible display devices are implemented on a thin substrate such as a plastic substrate or others. As such, the flexible display devices can be folded or rolled as paper without any damage. Therefore, the flexible display devices are being actively developed as the next generation display device.

A flexible display device according to the related art must have a panel thickness not less than 300 μm due to functional films attached to its upper and lower surfaces. This panel thickness makes the flexible display device to be not bent physically below a fixed curvature radius. Due to this feature, however, the display quality of the related art flexible display device deteriorates.

A panel can be forcibly bent below the fixed curvature radius. In this case, a large quantity of blowholes can be generated when a laminating process of a cover window is performed later. Also, the panel can be separated from the cover window due to its elastic property.

To address this matter, it would be desirable to have a display device which is adapted to bend the flexible substrate and which has an enhanced display quality.

BRIEF SUMMARY OF THE INVENTION

Accordingly, embodiments of the present invention are directed to a display device that substantially obviates one or more of problems due to the limitations and disadvantages of the related art.

The embodiments are to provide a display device that is adapted to easily bend a flexible substrate and enhance display quality.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment, a display device includes: a flexible substrate defined into a first area, a second area bent from an edge of the first area, and a third area outwardly expanded from the second area; a thin film transistor layer disposed on the substrate; an organic emission layer disposed on the thin film transistor layer; an encapsulation layer disposed on the organic emission layer; a polarization layer disposed on the encapsulation layer; and a cover window disposed on the polarization layer, wherein the polarization layer is formed on the encapsulation layer opposite to the first and third areas of the substrate.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
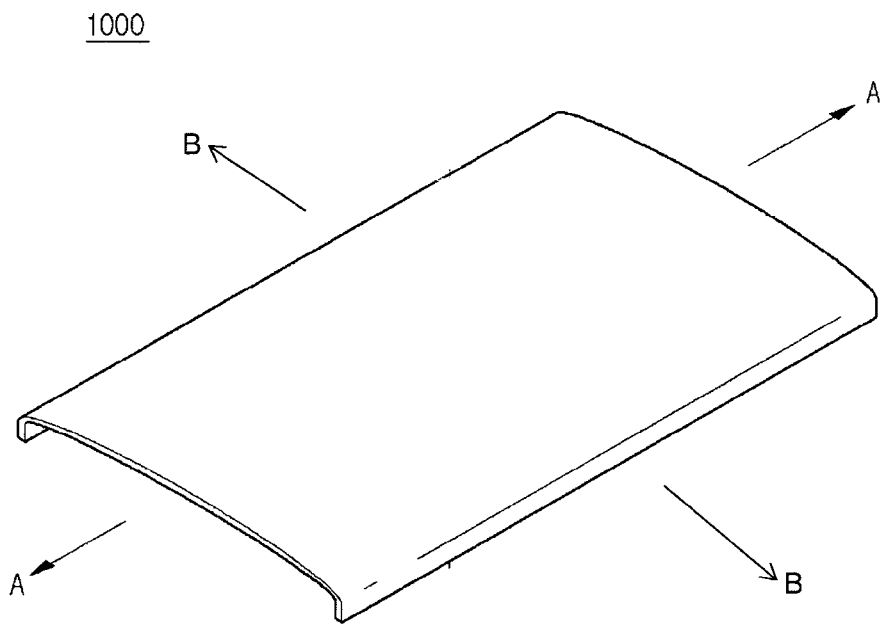
FIG. 1 is a perspective view showing a display device according to a first embodiment of the present invention.

Reference will now be made in detail to the embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
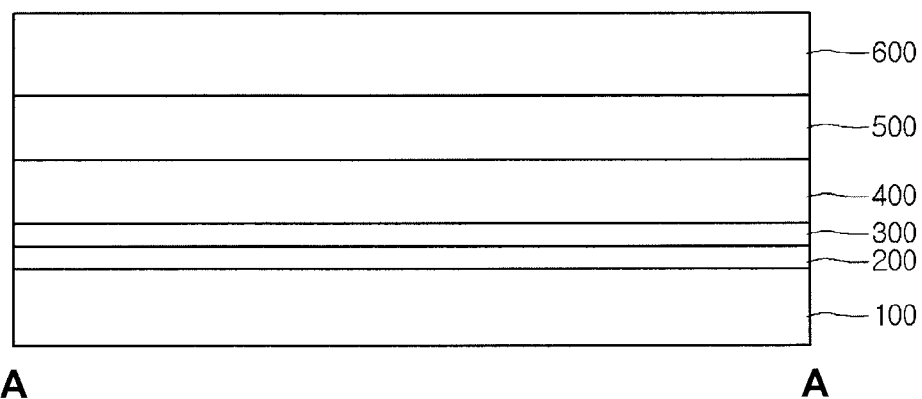
FIG. 2 is a cross-sectional view showing the display device taken along a line A-A in FIG. 1.
Figure 3:
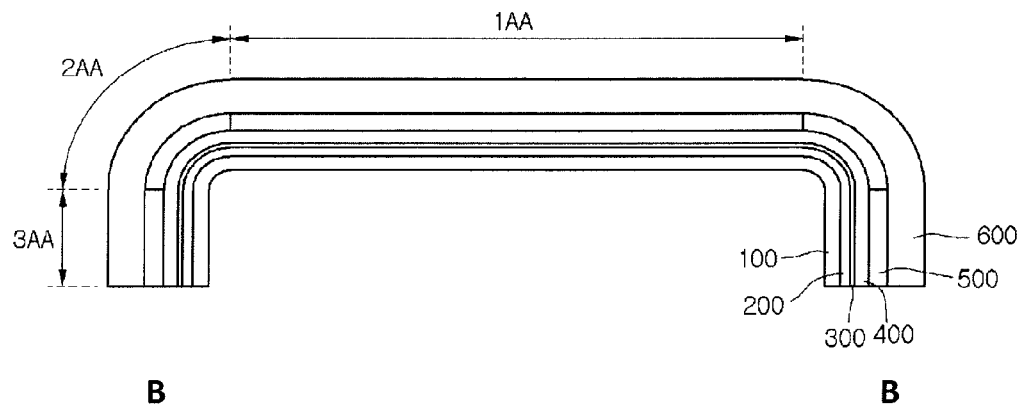
FIG. 3 is a cross-sectional view showing the display device taken along a line B-B in FIG. 1.
Figure 4:
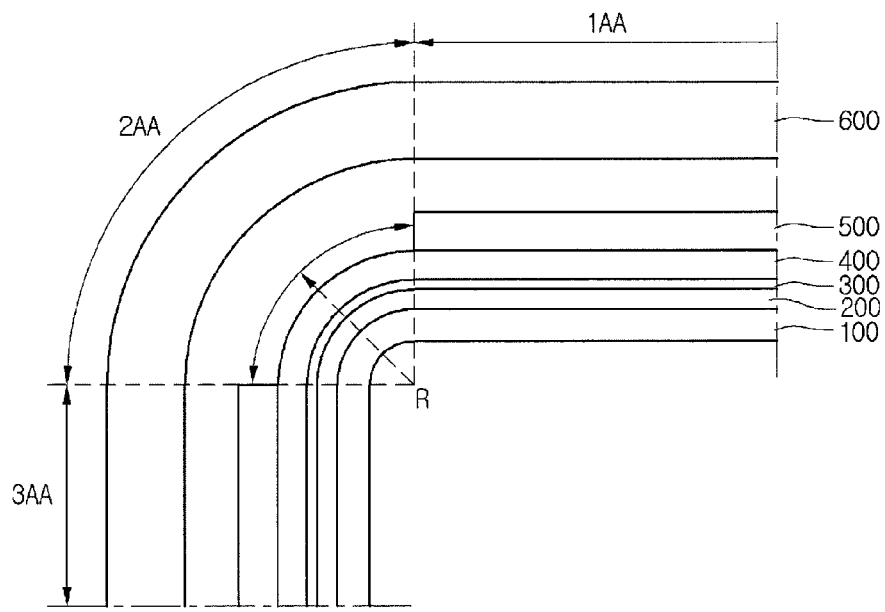
FIG. 4 is a cross-sectional view showing a part of a display device according to a first embodiment of the present invention.

FIG. 1 is a perspective view showing a display device according to a first embodiment of the present disclosure. FIG. 2 is a cross-sectional view showing the display device taken along a line A-A in FIG. 1. FIG. 3 is a cross-sectional view showing the display device taken along a line B-B in FIG. 1. FIG. 4 is a cross-sectional view showing a part of a display device according to a first embodiment of the present disclosure.

Referring to FIGS. 1 through 4, the display device 1000 according to a first embodiment of the present disclosure includes a substrate 100, a thin film transistor layer 200 disposed on the substrate 100, and an organic emission layer 300 disposed on the thin film transistor layer 200. Also, the display device 1000 includes an encapsulation layer 400 disposed on the organic emission layer 300, a polarization layer 500 disposed on the encapsulation layer 400, and a cover window 600 disposed on the polarization layer 500. All the components of the device 1000 are operatively coupled and configured.

The substrate 100 can be formed in a quadrilateral plate shape. For example, the substrate 100 can be formed in a rectangular plate shape. Also, the substrate 100 can be formed from a flexible material. As an example of the substrate 100, a plastic substrate can be used.

In order to better endure high temperatures, the plastic substrate 100 can be formed from a plastic polymer material with a superior heat-resisting property. For example, the plastic substrate 100 can be formed from a plastic polymer, such as polyehtersulfone PES, polyacrylate PAR, polyehterimide PEI, polyethylenenaphthalate PEN, polyethyleneterephthalate PET or others. Alternatively, the substrate 100 can become a metal substrate which is formed from aluminum Al, copper Cu or others.

The substrate 100 can be defined into a first area 1AA, which is used to display images, a second area 2AA and a third area 3AA.

The first area 1AA can be used as a display area for displaying images. The second area 2AA can become an edge area of the first area 1AA. The second area 2AA can be bent downwardly from an edge of the first area 1AA. Actually, the second area 2AA can be downwardly bent in a curvature radius below 5 mmR based on the first area 1AA. Such a second area 2AA can be a non-display area.

The third area 3AA can be prepared by expanding outwardly from the second area 2AA. Also, the third area 3AA can become a side surface of the display device 1000. Moreover, the third area 3AA can be used as another display area. Actually, the third area 3AA can display an image including a power state, buttons and so on.

The thin film transistor layer 200 can be disposed on the substrate 100.

The thin film transistor layer 200 can be configured to include a data line, a switching thin film transistor, a driving thin film transistor, a storage capacitor, a power voltage supply line, a ground voltage supply line and so on. The thin film transistors can become n-type MOSFETs (metal oxide semiconductor field effect transistors) or p-type MOSFETs. Such thin film transistors are well known to ordinary persons. As such, the detailed description of the thin film transistors will be omitted.

The organic emission layer 300 can be disposed on the thin film transistor layer 200.

The organic emission layer 300 can include a first electrode layer, a hole injection layer, a hole transport layer, an emission layer, an electron transport layer, an electron injection layer and a second electrode layer which are sequentially formed on the thin film transistor layer 200.

The first electrode layer can penetrate through a buffer layer, an overcoat layer and a passivation film and come in contact with the driving thin film transistor which is formed on the flexible substrate 100. Also, the first electrode layer can become an anode electrode with a reflective film or a cathode electrode according to connection configuration with the driving thin film transistor. Moreover, the first electrode layer can be formed from a transparent conductive material including an oxide, such as ITO (indium-tin-oxide), IZO (indium-zinc-oxide) or others. Furthermore, the first electrode layer can be formed on a reflective film, which is formed from an opaque metal material, and patterned in the units of pixels. Such a first electrode layer can transfer holes applied from the driving thin film transistor to the emission layer via the hole injection layer and the hole transport layer.

The second electrode layer can be used as a cathode electrode when the first electrode layer is used as an anode electrode. Also, the second electrode layer can be formed a single layer structure of a metal material. Alternatively, the second electrode layer can be formed in a multi-layered structure with at least two metal layers which are interposed between organic layers.

The encapsulation layer 400 can be disposed on the organic emission layer 300. The encapsulation layer 400 can be used to protect the organic emission layer 300. Also, the encapsulation layer 400 can protect the thin film transistor layer 200.

The encapsulation layer 400 can become one of an organic insulation layer and an insulation film. The organic insulation layer can be formed from one selected from a material group which includes benzocyclobutane BCB, an acrylic-based organic compound, fluoropolyarrylether FPAE, cytop and perfluorocyclobutane PFCB.

The polarization layer 500 can be formed on the encapsulation layer 400.

The polarization layer 500 can be used to polarize light. Also, the polarization layer 500 can be a resin film including polarization particles. Moreover, the polarization layer 500 can be formed on the encapsulation layer 400 opposite to the first area 1AA and the third area 3AA of the substrate 100. Such a polarization layer 500 can be prepared by forming a polarization material layer on the entire surface of the encapsulation layer 400, which includes the first area IAA, the second area 2AA and the third area 3AA of the substrate 100, and then removing the polarization material layer from the encapsulation layer 400 opposite to (e.g., facing) the second area 2AA of the substrate 100.

The second area 2AA of the substrate 100 corresponds to a bending area of the panel. As such, when the polarization layer 500 is removed from the second area 2AA, the thickness of the panel can be reduced. In accordance therewith, the panel can be bent in a curvature radius below 5 mmR.

The removing area of the polarization layer 500 is set to the same size as the second area 2AA of the substrate 100, but it is not limited to this. In other words, the removing area of the polarization layer 500 can be set to be narrower than the second area 2AA of the substrate 100. Alternatively, the removing area of the polarization layer 500 can be set to be wider than the second area 2AA of the substrate 100. In this case, the removing area of the polarization layer 500 can be expanded up to the first area 1AA and the third area 3AA of the substrate 100.

The cover window 600 can be disposed on the polarization layer 500. As shown in FIG. 3, the cover window 600 in all the embodiments is preferably disposed directly on the polarization layer 500. However, in some figures, a space may be shown between the cover window 600 and the polarization layer 500 in the areas corresponding to the first and third areas 1AA and 3AA. Such a space is not intended to limit the associated features by it, but is included only as a result of showing an exploded view of the layers of the display device for easy understanding.

The cover window 600 can be used to protect the panel. Also, the cover window 600 can be formed from a flexible material. For example, the cover window 600 can be formed from one of a plastic material, glass and a metal material.

Figure 5:
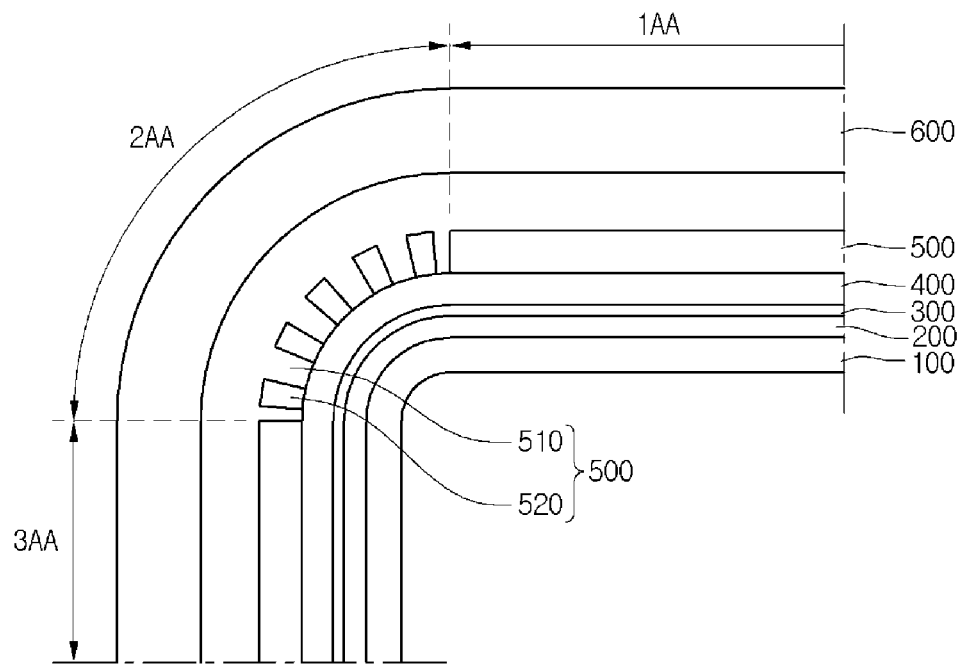
FIG. 5 is a cross-sectional view showing a part of a display device according to a second embodiment of the present invention.

FIG. 5 is a cross-sectional view showing a part of a display device according to a second embodiment of the present disclosure.

Referring to FIG. 5, the display device according to a second embodiment of the present disclosure includes a substrate 100, a thin film transistor layer 200 disposed on the substrate 100, an organic emission layer 300 disposed on the thin film transistor layer 200, an encapsulation layer 400 disposed on the organic emission layer 300, a polarization layer 500 disposed on the encapsulation layer 400, and a cover window 600 disposed on the polarization layer 500. The display device of the second embodiment has the same configuration as that of the first embodiment with the exception of the polarization layer 500. As such, the description of the second embodiment overlapping with the first embodiment will be omitted.

The substrate 100 can be defined into a first area 1AA, a second area 2AA, and a third area 3AA.

The first area 1AA can be used as a display area for displaying images. The second area 2AA can be an edge area of the first area 1AA. The second area 2AA can be bent downwardly from an edge of the first area 1AA. Actually, the second area 2AA can be bent downwardly in a curvature radius below 5 mmR based on the first area 1AA. Such a second area 2AA can be a non-display area. The third area 3AA can be prepared by expanding outwardly from the second area 2AA. Also, the third area 3AA can become a side surface of the display device. Moreover, the third area 3AA can be used as another display area.

The polarization layer 500 can be disposed on the encapsulation layer 400. Also, the polarization layer 500 can be a resin film including polarization particles. Moreover, the polarization layer 500 can include a non-patterned portion 510 and a patterned portion 520.

The non-pattern portion 510 of the polarization layer 500 can be disposed on the encapsulation layer 400 opposite the first area 1AA and the third area 3AA of the substrate 100. On the other hand, the patterned portion 520 of the polarization layer 500 can be disposed on the encapsulation layer 400 opposite to the second area 2AA of the substrate 100.

The patterned portion 520 can include a plurality of lands (or bars) which is arranged on the encapsulation layer 400 opposite to the second area 2AA of the substrate 100. The lands (or bars) of the patterned portion 520 can be formed in such a manner as to extend along a direction perpendicular to a bending direction. Also, the lands (or bars) of the patterned portion 520 can be arranged parallel to one another in the bending direction of the substrate 100 in such a manner as to be separated from one another. Moreover, the lands (or bars) of the patterned portion 520 can be formed by partially removing the polarization layer 500 from the encapsulation layer 400 opposite to the second area 2AA of the substrate 100 along the direction perpendicular to the bending direction of the substrate 100.

Alternatively, the patterned portion 520 can include a plurality of insular prominences which is arranged on the encapsulation layer 400 opposite to the second area 2AA of the substrate 100. The insular prominences of the patterned portion 520 can be arranged along the bending direction of the substrate 100 and a perpendicular direction thereto in such a manner as to be separated from one another by a fixed distance. Also, the insular prominences of the patterned portion 520 can be formed by partially removing the polarization layer 500 from the encapsulation layer 400 opposite to the second area 2AA of the substrate 100 along the bending direction of the substrate 100 and the perpendicular direction thereto.

The second area 2AA of the substrate 100 is used as a bending area of the panel. Also, the lands (or the insular prominences) of the patterned portion 520 of the polarization layer 500 are arranged parallel to one another along the bending direction in such a manner as to be separated from one another. As such, the panel can be easily bent in a curvature radius below 5 mmR.

Figure 6:
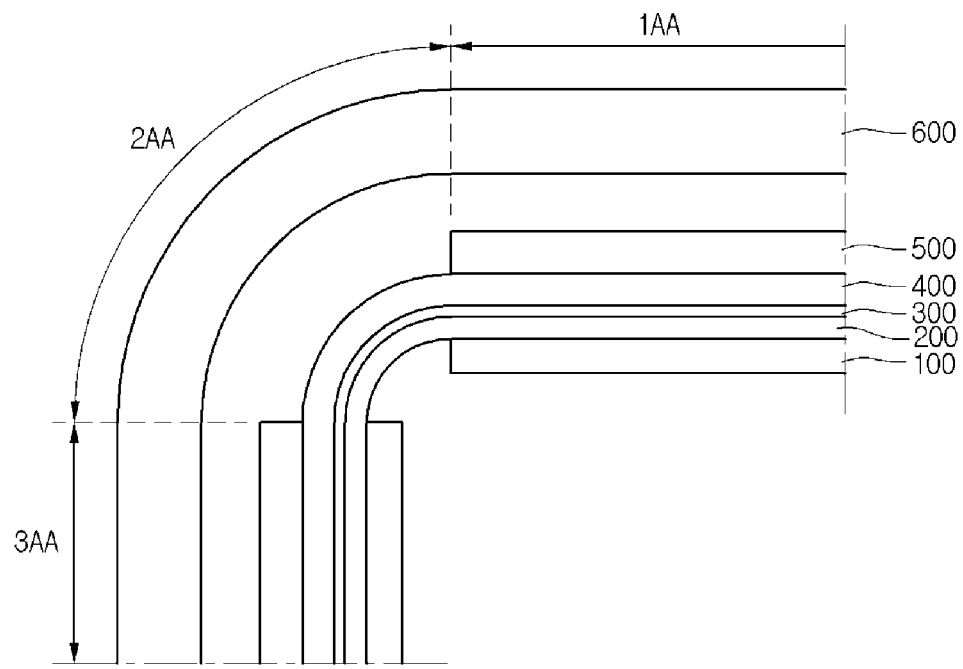
FIG. 6 is a cross-sectional view showing a part of a display device according to a third embodiment of the present invention.

FIG. 6 is a cross-sectional view showing a part of a display device according to a third embodiment of the present disclosure.

Referring to FIG. 6, the display device according to a third embodiment of the present disclosure includes a substrate 100, a thin film transistor layer 200 disposed on the substrate 100, an organic emission layer 300 disposed on the thin film transistor layer 200, an encapsulation layer 400 disposed on the organic emission layer 300, a polarization layer 500 disposed on the encapsulation layer 400, and a cover window 600 disposed on the polarization layer 500. The display device of the third embodiment has the same configuration as that of the first embodiment with the exception of the substrate 100. As such, the description of the third embodiment overlapping with the first embodiment will be omitted.

The substrate 100 can be formed opposite to a first area 1AA and a third area 3AA which are used as display areas for displaying images.

The substrate 100 can be formed in a quadrilateral plate shape. For example, the substrate 100 can be formed in a rectangular plate shape. Also, the substrate 100 can be formed from a flexible material. As an example of the substrate 100, a plastic substrate can be used. In order to well endure high temperatures, the plastic substrate 100 can be formed from a plastic polymer material with a superior heat-resisting property. For example, the plastic substrate 100 can be formed from a plastic polymer, such as polyehtersulfone PES, polyacrylate PAR, polyehterimide PEI, polyethylenenaphthalate PEN, polyethyleneterephthalate PET or others. Alternatively, the substrate 100 can become a metal substrate which is formed from aluminum Al, copper Cu or others.

The substrate 100 can be formed by preparing a primary substrate being opposite to the first area 1AA, the second area 2AA and the third area 3AA, sequentially forming the above-mentioned components on the primary substrate, and removing a part of the primary substrate opposite to the second area 2AA which is used as a non-display area.

In this manner, the substrate 100 is formed opposite to only the first area 1AA and the third area 3AA which are used as the display areas, like the polarization layer 500. As such, the thickness of the panel can be reduced. In accordance therewith, the panel can be easily bent in a curvature radius below 5 mmR.

Figure 7:
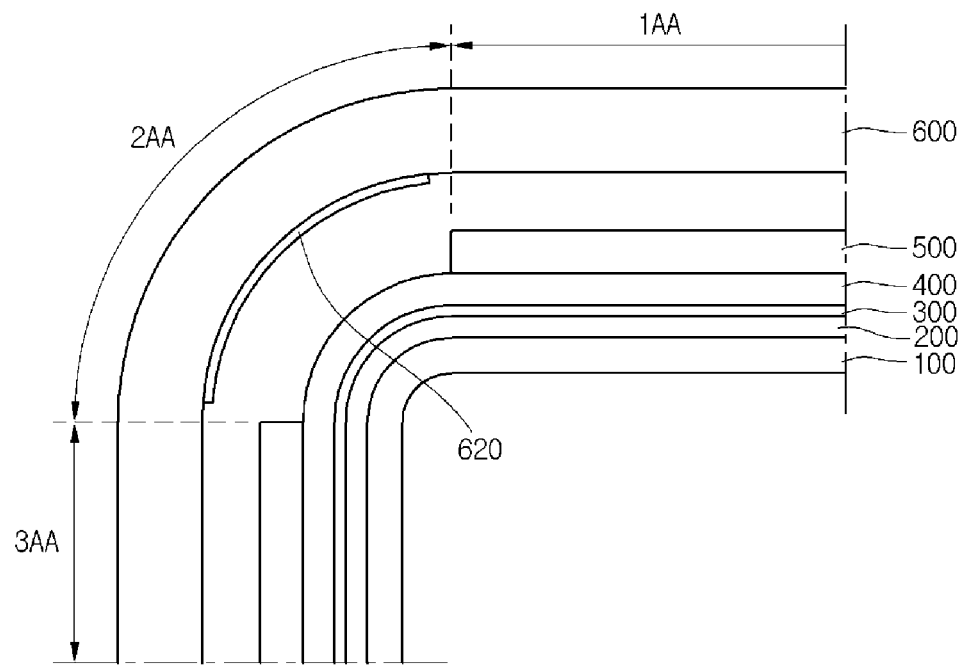
FIG. 7 is a cross-sectional view showing a part of a display device according to a fourth embodiment of the present invention.

FIG. 7 is a cross-sectional view showing a part of a display device according to a fourth embodiment of the present disclosure.

Referring to FIG. 7, the display device according to a fourth embodiment of the present disclosure includes a substrate 100, a thin film transistor layer 200 disposed on the substrate 100, an organic emission layer 300 disposed on the thin film transistor layer 200, an encapsulation layer 400 disposed on the organic emission layer 300, a polarization layer 500 disposed on the encapsulation layer 400, and a cover window 600 disposed on the polarization layer 500. The display device of the fourth embodiment has the same configuration as that of the first embodiment with the exception of the cover window 600. As such, the description of the fourth embodiment overlapping with the first embodiment will be omitted.

The substrate 100 can be defined into a first area 1AA used to display images, a second area 2AA, and a third area 3AA.

The first area 1AA can be used as a display area for displaying images. The second area 2AA can be an edge area of the first area 1AA. The second area 2AA can be bent downwardly from an edge of the first area 1AA. Actually, the second area 2AA can be bent downwardly in a curvature radius below 5 mmR based on the first area 1AA. Such a second area 2AA can be a non-display area. The third area 3AA can be an expansion area expanded outwardly from the second area 2AA. Also, the third area 3AA can become a side surface of the display device. Moreover, the third area 3AA can be used as another display area.

The cover window 600 can be used to protect the panel. Also, the cover window 600 can be formed from a flexible material. For example, the cover window 600 can be formed from one of a plastic material, glass and a metal material.

A shield layer 620 can be formed on an inner surface of the cover window 600. In detail, the shield layer 620 can be disposed on the inner surface of the cover window 600 opposite to the second area 2AA of the substrate 100. Also, the shield layer 620 can become one of an opaque resin film and an opaque insulation film. Such a shield layer 620 can prevent deterioration of image quality which is caused by a light leakage phenomenon in the second area 2AA.

Figure 8:
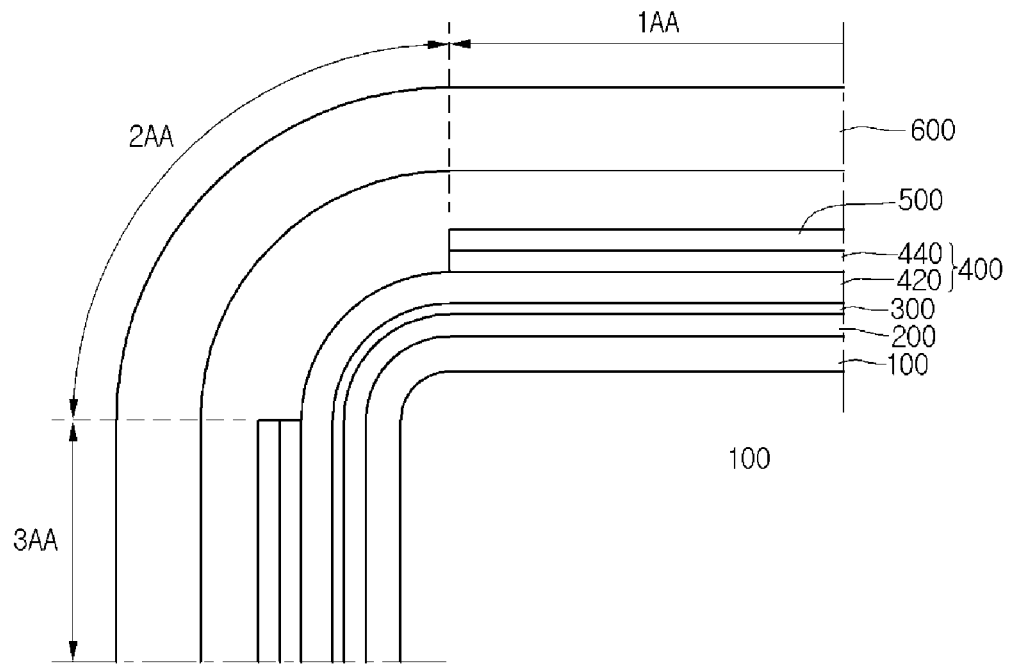
FIG. 8 is a cross-sectional view showing a part of a display device according to a fifth embodiment of the present invention.

FIG. 8 is a cross-sectional view showing a part of a display device according to a fifth embodiment of the present disclosure.

Referring to FIG. 8, the display device according to a fifth embodiment of the present disclosure includes a substrate 100, a thin film transistor layer 200 disposed on the substrate 100, an organic emission layer 300 disposed on the thin film transistor layer 200, an encapsulation layer 400 disposed on the organic emission layer 300, a polarization layer 500 disposed on the encapsulation layer 400, and a cover window 600 disposed on the polarization layer 500. The display device of the fifth embodiment has the same configuration as that of the first embodiment with the exception of the encapsulation layer 400. As such, the description of the fifth embodiment overlapping with the first embodiment will be omitted.

The substrate 100 can be defined into a first area 1AA, which is used to display images, a second area 2AA and a third area 3AA. The first area 1AA can be used as a display area for displaying images. The second area 2AA can be an edge area of the first area 1AA. The second area 2AA can be bent downwardly from an edge of the first area 1AA. Actually, the second area 2AA can be bent downwardly in a curvature radius below 5 mmR based on the first area 1AA. Such a second area 2AA can be a non-display area. The third area 3AA can be an expansion area expanded outwardly from the second area 2AA. Also, the third area 3AA can become a side surface of the display device 1000. Moreover, the third area 3AA can be used as another display area.

The encapsulation layer 400 can be disposed on the organic emission layer 300. The encapsulation layer 400 can include a first encapsulation layer 420 and a second encapsulation layer 440. The first encapsulation layer 420 can be formed from an organic insulation material. The second encapsulation layer 440 can be from a resin material.

The first encapsulation layer 420 can be disposed on the organic emission layer 300 opposite to the first area 1AA, the second area 2AA and the third area 3AA of the substrate 100. The second encapsulation layer 440 can be disposed on the first encapsulation layer 420 opposite to the first area 1AA and the third area 3AA of the substrate 100. Such a second encapsulation layer 440 can be prepared by forming a resin film on the entire surface of the first encapsulation layer 420 and removing the resin film from the first encapsulation layer 420 opposite to the second area 2AA of the substrate 100.

In this way, the second encapsulation layer 440 is formed opposite to only the first area 1AA and the third area 3AA which are used as the display areas, like the polarization layer 500. As such, the thickness of the panel can be reduced. In accordance therewith, the panel can be easily bent in a curvature radius below 5 mmR.

The thickness of the panel in the bending area can be minimized by partially removing at least one of the polarization layer, the substrate and the encapsulation layer, but it is not limited to this. In other words, when a touch screen is additionally disposed, the thickness of the panel can be minimized by removing a part of the touch screen.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a flexible substrate including a first area, a second area bent from an edge of the first area, and a third area extending from the second area;
    a thin film transistor layer disposed on the flexible substrate;
    an organic emission layer disposed on the thin film transistor layer;
    an encapsulation layer disposed on the organic emission layer;
    a polarization layer disposed on the encapsulation layer; and
    a cover layer disposed on the polarization layer,
    wherein the polarization layer is disposed on the encapsulation layer opposite to the first and third areas of the flexible substrate, while no polarization layer is disposed on the encapsulation layer opposite to the second area of the flexible substrate.

2. The display device of claim 1, wherein the encapsulation layer includes:
    a first encapsulation layer disposed on the organic emission layer, and a second encapsulation layer disposed on the first encapsulation layer opposite to the first and third areas of the flexible substrate while no second encapsulation layer is disposed on the first encapsulation layer opposite to the second area of the flexible substrate.

3. The display device of claim 1, further comprising a shield layer disposed on an inner surface of the cover layer opposite to the second area of the flexible substrate.

4. The display device of claim 1, wherein the third area of the flexible substrate is substantially perpendicular to the first area of the flexible substrate.

5. The display device of claim 1, wherein the second area of the flexible substrate is bent in a curvature radius below 5 mmR based on the first area of the flexible substrate.

6. The display device of claim 1, wherein the second area of the flexible substrate is removed.

7. The display device of claim 1, wherein the first and third areas of the flexible substrate are display areas for displaying images, and the second area of the flexible substrate is a non-display area.

8. The display device of claim 1, further comprising a shield layer disposed on an inner surface of the cover layer that corresponds to the second area of the flexible substrate.

9. A display device comprising:
   a flexible substrate defined into a first area, a second area bent from an edge of the first area, and a third area outwardly expanded from the second area;
   a thin film transistor layer disposed on the flexible substrate;
   an organic emission layer disposed on the thin film transistor layer;
   an encapsulation layer disposed on the organic emission layer;
   a polarization layer disposed on the encapsulation layer; and
   a cover window disposed on the polarization layer,
   wherein the polarization layer is formed on the encapsulation layer opposite to the first and third areas of the flexible substrate, and
   wherein the polarization layer includes a patterned portion disposed on the encapsulation layer opposite to the second area of the flexible substrate.

10. The display device of claim 9, wherein the patterned portion of the polarization layer includes a plurality of lands arranged substantially parallel to one another in a bending direction.

11. The display device of claim 10, wherein the patterned portion of the polarization layer is formed by partially removing the polarization layer along a perpendicular direction to the bending direction.

12. The display device of claim 9, wherein the patterned portion of the polarization layer includes a plurality of insular prominences arranged in a bending direction and a perpendicular direction with respect to the bending direction.

13. The display device of claim 12, wherein the patterned portion of the polarization layer is formed by partially removing the polarization layer along the bending direction and the perpendicular direction.

14. A display device comprising:
   a flexible substrate defined into a first area, a second area bent from an edge of the first area, and a third area outwardly expanded from the second area;
   a thin film transistor layer disposed on the flexible substrate;
   an organic emission layer disposed on the thin film transistor layer;
   an encapsulation layer disposed on the organic emission layer;
   a polarization layer disposed on the encapsulation layer; and
   a cover window disposed on the polarization layer,
   wherein the polarization layer is formed on the encapsulation layer opposite to the first and third areas of the flexible substrate, and
   wherein the second area of the flexible substrate is removed.

* * * * *